United States Patent [19]
Makiyama et al.

[11] Patent Number: 5,640,626
[45] Date of Patent: Jun. 17, 1997

[54] BATTERY VOLTAGE DETECTION DEVICE USING PULSE WIDTH MODULATION CONTROL

[75] Inventors: Yutaka Makiyama, Mobara; Seiichi Yasukawa, Yotsukaido, both of Japan

[73] Assignee: Nikon Corporation, Tokyo, Japan

[21] Appl. No.: 522,578

[22] Filed: Sep. 1, 1995

[30] Foreign Application Priority Data

Nov. 2, 1994 [JP] Japan ................................. 6-269290

[51] Int. Cl.[6] .......................... G03B 17/18; G01R 19/02
[52] U.S. Cl. ......................... 396/287; 396/301; 340/636
[58] Field of Search .......................... 354/468, 484, 354/471, 474, 475; 340/636; 396/287, 301

[56] References Cited

U.S. PATENT DOCUMENTS 5,142,233  8/1992  Serita ................... 340/636 X
5,268,845 12/1993  Startup et al. ........... 340/636 X

*Primary Examiner*—W. B. Perkey

[57] ABSTRACT

A battery voltage detection system, suitable for a photographic device, having a battery power source. The battery voltage detection system includes a circuit to generate varying periodic signals, such as PWM control signals, and a battery voltage detection device to measure the battery voltage a plurality of times within a predetermined time period and to detect the battery voltage based on the plural battery voltage measurements. The battery voltage detection device performs the plural measurements of the battery voltage during the generation of the varying periodic signals. The plural measurements are combined by taking an average value or a root mean square value of the battery measurements to determined the battery voltage. The battery voltage detected by the battery voltage detection device is then compared with a predetermined standard value to determined the state of the battery.

15 Claims, 4 Drawing Sheets

BATTERY VOLTAGE DETECTION DEVICE USING PULSE WIDTH MODULATION CONTROL

BACKGROUND OF THE INVENTION

1. Field of the Invention

The present invention relates to a battery voltage detection device suitable for use in a photographic device, and, more particularly, the present invention relates to a battery voltage detection device for a photographic device which uses a plurality of battery voltage measurements taken during pulse width modulation control to determine battery voltage.

2. Description of the Related Art

Cameras have in recent years become multifunctional devices having various sophisticated electronic components and systems which are supplied power by a battery built into the camera. However, the battery gradually becomes exhausted and the battery voltage falls as a result of operating various camera systems, such as autofocus ("AF"), automatic exposure ("AE"), strobe light generation, and the display of photographic information in the viewfinder. More specifically, the camera battery is used as a common power supply for an AF drive motor, shutter drive magnets, a mirror drive motor, a built-in strobe charging circuit, a circuit which drives an LED used for backlighting a liquid crystal display in the viewfinder, and the like. Further, the camera battery is used as a power supply for integrated circuits ("ICs") of a microcomputer, sensors, motor drivers, and the like, which control the above-described motors, circuits, etc.

A DC-DC converter converts the camera battery voltage to 5 V or 12 V, as appropriate, to supply power to the ICs. When the camera battery is exhausted and the battery voltage falls, resulting in a fall of the output voltage of the DC-DC converter, the ICs do not operate normally, and anomalies arise in the control of the autofocus system, the automatic exposure system, and the like. To prevent such anomalies caused by a fall in the battery voltage, battery check devices to check the state of exhaustion of the battery have been developed.

In accordance with a known battery check device, it is determined whether photography is possible by detecting the battery voltage at constant time intervals during a predetermined time period (for example 8 seconds) starting from when a release button is half-depressed. The above-described detection of the battery voltage is not performed during an AF operation or during charging of the built-in strobe, when there is a temporary fall of the battery voltage. However, a problem occurs in the known battery check device because the camera battery is used to supply power to various camera systems and devices, and the battery voltage is subject to the effects of changes in the operation of circuits. Moreover, error components are usually included in the battery detection result, and as a result the battery voltage can not be accurately detected.

For example, the camera battery voltage changes with the operation of a light emitting diode ("LED") used for backlighting a liquid crystal display in the viewfinder. Specifically, the ON/OFF ratio of the LED used for backlighting the liquid crystal display in the viewfinder is set by pulse width modulation ("PWM") control. Further, when PWM control performs the switching ON and OFF of the LED for liquid crystal backlighting, the current flowing to the LED changes greatly when the LED is switched ON and when the LED is switched OFF.

FIG. 4 is a graph showing the change in measured battery voltage with respect to time as affected by PWM control. In FIG. 4, $T_0$ denotes a period during which the voltage of the battery is caused to change when PWM control is performed. For example, a large difference results between the measured battery voltage value $m_{11}$ measured at the instant $a_1$, and the measured battery voltage value $m_{21}$ measured at the instant $a_2$. Furthermore, when a filter circuit or the like is used to eliminate the variation in measured battery voltage caused when the PWM control sets the ON/OFF ratio of the LED used for backlighting a liquid crystal display, the cost of the camera is increased.

SUMMARY OF THE INVENTION

It is an object of the present invention to provide a battery voltage detection device, suitable for a photographic device, which accurately performs the detection of battery voltage.

It is another object of the present invention to provide a battery voltage detection device, suitable for a photographic device, which accurately performs detection of battery voltage using a plurality of battery voltage measurements taken during PWM control.

Objects and advantages of the present invention are attained with a battery voltage detection system suitable for a photographic device having a battery as a drive source and including a circuit to generate varying periodic signals and a battery voltage detection device to perform plural measurements of the battery voltage within a predetermined time period and to detect the battery voltage based on the plural battery voltage measurements. The battery voltage detection device performs the plural measurements of the battery voltage during the generation of the varying periodic signal. The respective intervals of the plural measurements are about equal within the predetermined time period.

The battery voltage detection device includes a calculating unit to perform an averaging calculation or a root mean square calculation of the plural voltage measurements, a decision unit to compare the result of the calculating unit with a predetermined standard value to decide the state of exhaustion of the battery and a display to display the state of exhaustion.

In accordance with embodiments of the present invention, the circuit which generates the varying periodic signals is a circuit which performs PWM control.

In accordance with embodiments of the present invention, the circuit which performs PWM control is a circuit which controls an LED used for backlighting a liquid crystal display for displaying photographic information.

In accordance with embodiments of the present invention, the battery voltage detection device measures the voltage of the battery a plurality of times at approximately equal intervals during the predetermined time period during generation of the varying periodic signal. Further, because the respective intervals of the plural voltage measurements are about equal within the predetermined time period, the voltage of the battery can be accurately measured.

BRIEF DESCRIPTION OF THE DRAWINGS

These and other objects and advantages of the present invention will become apparent and more readily appreciated from the following description of the preferred embodiments, taken in conjunction with the accompanying drawings of which.

DESCRIPTION OF THE PREFERRED EMBODIMENTS

Figure 1:
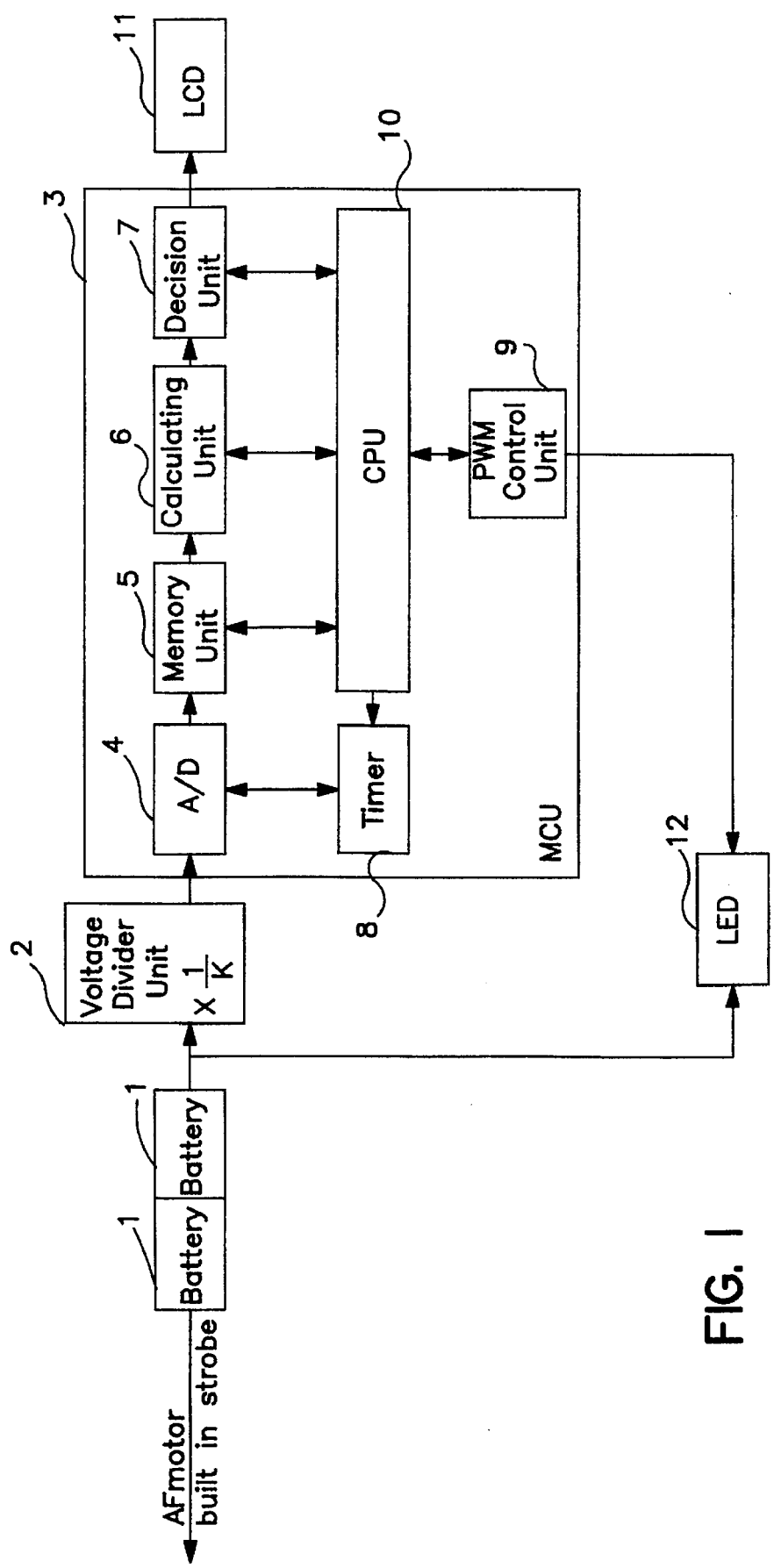
FIG. 1 is a block diagram of a battery voltage detection device suitable for use in a camera in accordance with embodiments of the present invention.

Reference will now be made in detail to the present preferred embodiments of the present invention, examples of which are illustrated in the accompanying drawings, wherein like reference numerals refer to like elements throughout.

FIG. 1 is a block diagram of a battery voltage detection device, suitable for use in a photographic device such as a camera, in accordance with embodiments of the present invention. As shown in FIG. 1, a battery 1 is the main power supply for the operation of the camera. In accordance with embodiments of the present invention, the main power supply preferably comprises two CR123A lithium batteries.

The output voltage of the battery 1 is input to a voltage divider circuit 2. The voltage divider circuit 2 forms an analog voltage which is proportional to the output voltage of the battery 1 when the input voltage of later stage circuits have a dynamic range which is smaller than the maximum output voltage of the battery 1 (open circuit voltage of about 6 V).

In accordance with embodiments of the present invention, the dynamic range of the microcomputer unit ("MCU") 3, described in detail below, is preferably set to 5 V, and the division constant 1/K of the voltage divider circuit 2 is preferably set to 5/6.

The MCU 3 comprises an A/D converter 4, a memory unit 5, a calculating unit 6, a decision unit 7, a timer 8, a PWM control unit 9 and a CPU 10. The A/D converter 4 receives the analog voltage proportional to the battery output voltage from the voltage divider circuit 2 and converts the analog signal from the voltage divider circuit 2 into a digital signal. The memory unit 5 stores the digital signal output from the A/D converter 4. The calculating unit 6 receives the digital signals which were stored in the memory unit 5 and performs an averaging calculation to calculate the battery voltage of the battery 1. The decision unit 7 performs a comparison of the battery voltage calculated by the calculating unit 6, and a predetermined standard value which has been set in advance, and decides whether or not the battery voltage of the battery 1 presents an obstacle to performing photography with the photographic device.

The decision result of the decision unit 7 is displayed in a liquid crystal display element 11, described in detail below. The timer 8 provides an A/D conversion commencement signal to the A/D converter 4. The PWM control unit 9 PWM controls an LED 12, which backlights a liquid crystal display within the viewfinder (not shown). The CPU 10 controls the memory unit 5, the calculating unit 6, the decision unit 7, the timer 8 and the PWM control unit 9. The LED 12 uses the battery 1 as a power supply. The battery 1 also supplies electric power to an AF motor and a built-in strobe (not shown).

The liquid crystal display element 11 performs a display of three different states relating to the battery 1 according to instructions from the MCU 3. Specifically, when the battery voltage of the battery 1 is sufficient for photography, the liquid crystal display element 11 performs a first display to the effect that photography is possible. When the voltage of the battery 1 is at the lowest possible limit for photography, the liquid crystal display element 11 performs a second display to the effect that preparations to replace the battery 1 are necessary. When the battery voltage is insufficient for photography to be performed, the liquid crystal display element 11 performs a third display to the effect that photography is impossible (or that it is necessary to change the battery 1).

Figure 2:
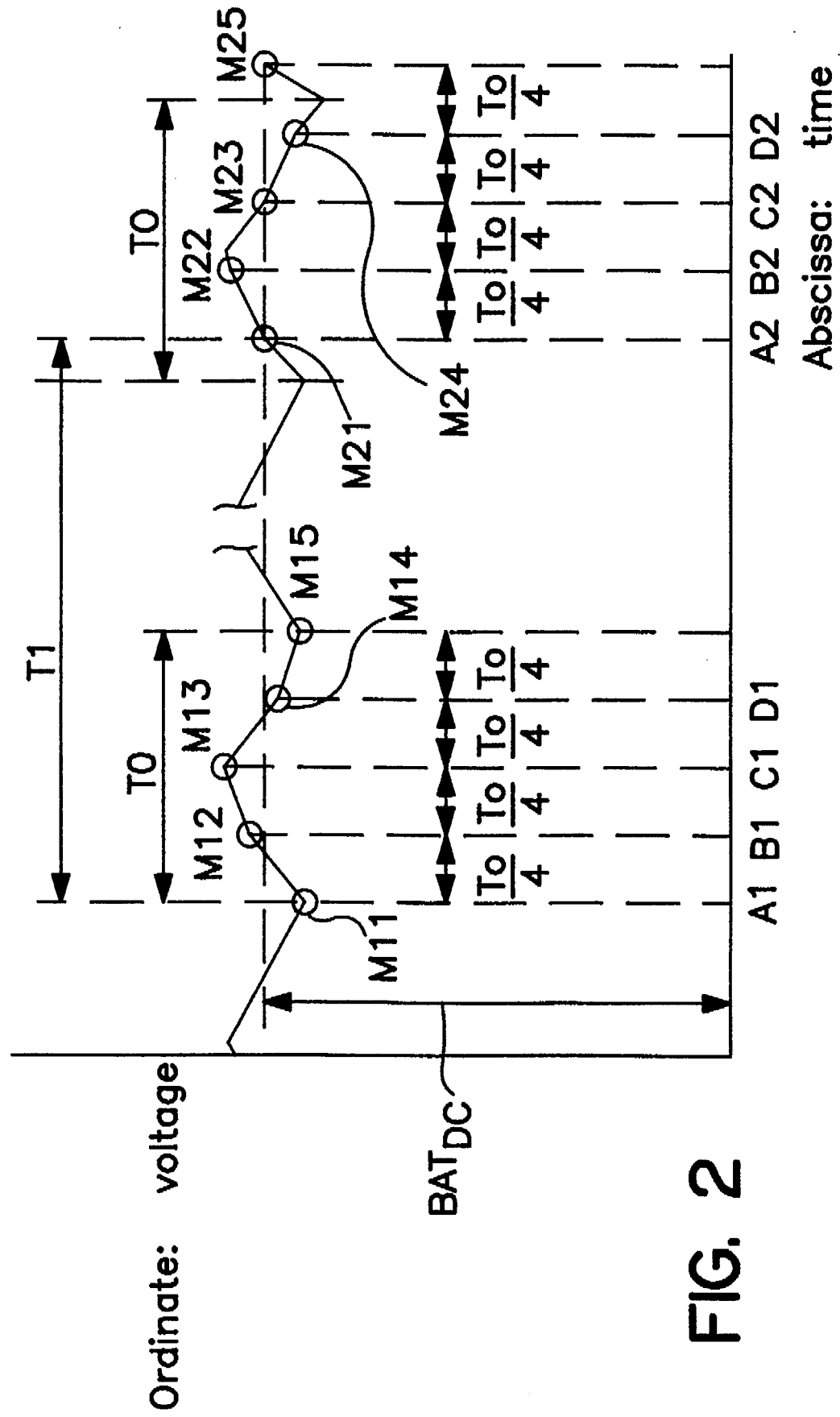
FIG. 2 is a graph showing an example of the measurement of the voltage of a battery in accordance with embodiments of the present invention.
Figure 3:
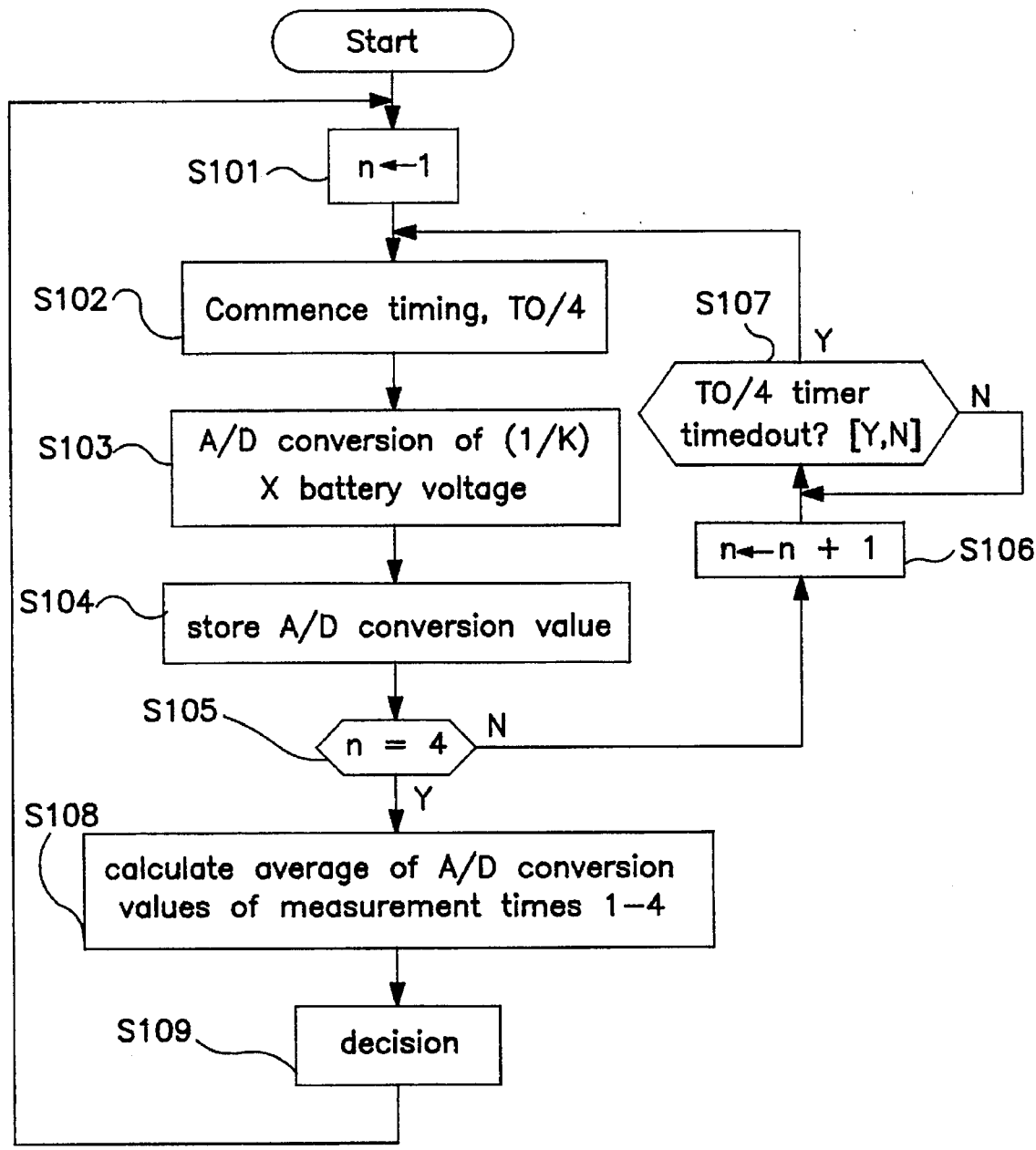
FIG. 3 is a flow chart showing an operational process for measuring battery voltage and determining a state of exhaustion of the battery in accordance with embodiments of the present invention.
Figure 4:
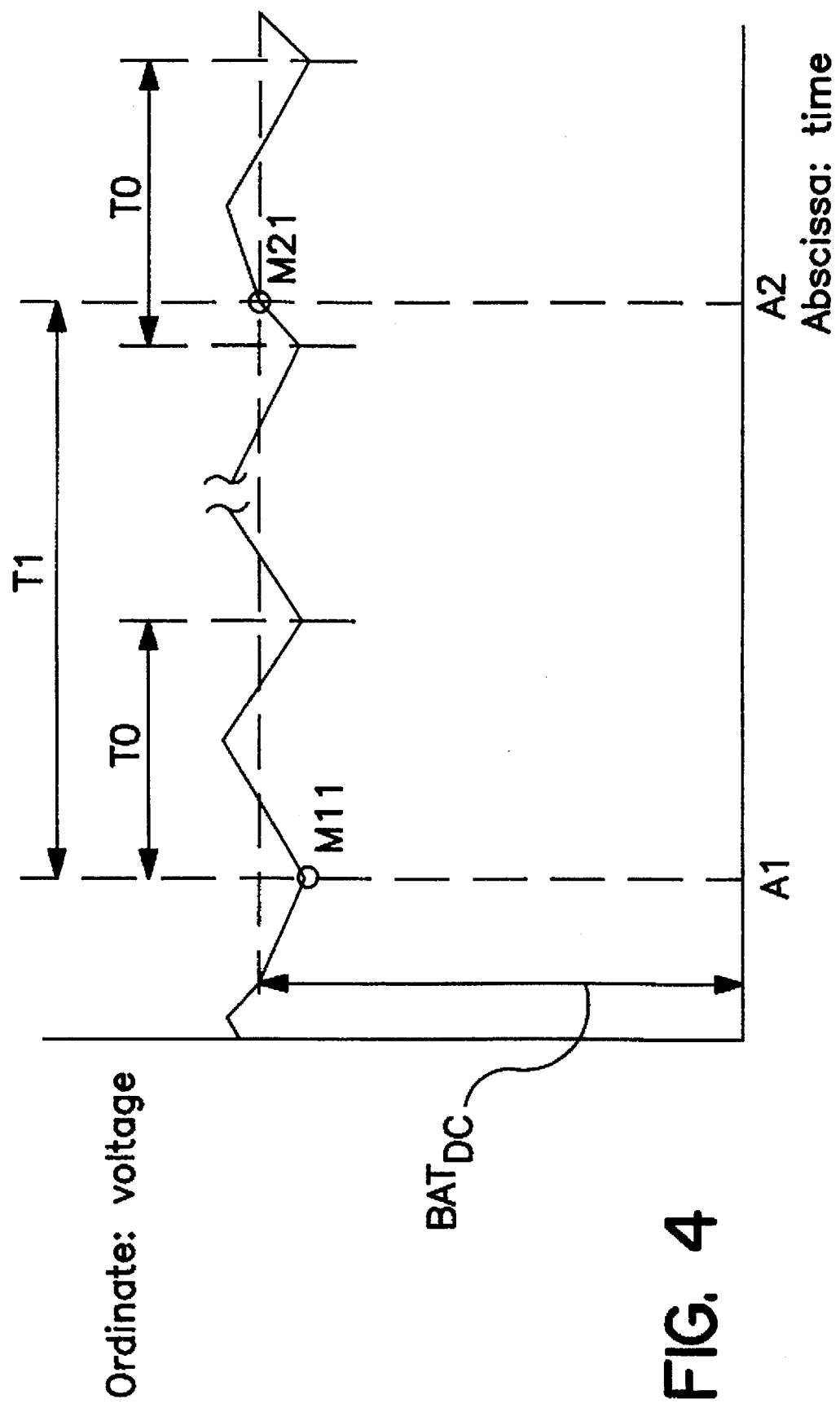
FIG. 4 is a graph showing changes of the voltage of a battery during PWM control.

Embodiments of the present invention will now be described with reference to FIGS. 2 and 3. FIG. 2 is a timing diagram showing an example of the measurement of the voltage of the battery 1. FIG. 3 is a flow chart showing an operational process for detecting battery voltage and determining the state of the battery in accordance with embodiments of the present invention.

In FIG. 2, time is shown on the horizontal axis and battery voltage on the vertical axis. $T_0$ represents a period during which change of the voltage of the battery 1 occurs when the LED 12 is PWM controlled by the PWM control unit 9. $T_1$ is an interval during which measurement of the voltage of the battery 1 is performed. $BAT_{DC}$ is the true battery voltage to be detected. As shown in FIG. 2, the voltage of the battery 1 is affected by the PWM control and varies from the true voltage $BAT_{DC}$ during PWM control.

The variables A1, B1, C1 and D1 represent battery voltage measurement instants during a first voltage measurement interval $T_1$ of the battery 1. The period represented by $T_0$ is divided into four equal time periods $T_0/4$. In accordance with embodiments of the present invention, an average value of the four battery voltage measurements taken at A1, B1, C1 and D1, respectively, is used as a measurement value of the battery voltage. $M_{11}$–$M_{14}$ are measurement values corresponding to the battery voltage at measurement instants A1–D1, respectively. Moreover, the battery voltage $M_{15}$ is not actually measured, but because the period represented by the symbol $T_0$ is equally divided into four time periods $T_0/4$, the measurement point $M_{15}$ shown is for convenience.

Similarly, the symbols A2, B2, C2 and D2 show measurement instants during a second voltage measurement interval of the battery 1. $M_{21}$–$M_{24}$ are measurement values corresponding to the measurement instants A2–D2, respectively.

In accordance with embodiments of the present invention, the time period which $T_0$ represents is preferably set to 256 μsec, which corresponds to a 100% duty of the PWM control pulse which the PWM control unit 9 outputs. Accordingly, four measurements of the battery voltage are performed during the 256 μsec period, one measurement each 64 μsec.

When the release switch (not shown) is half depressed, the operational process shown in the flow chart of FIG. 3 is performed to measure the battery voltage. The CPU 10 controls the operational process steps shown in FIG. 3. When the operational process shown in the flow chart of FIG. 3 is performed, the AF motor and built-in strobe are not driven.

First, initialization setting is performed (step S101) during which a variable n is set to 1. The variable n represents the number of times the battery voltage is measured. Next, the timer 8 begins to time 64 μsec ($T_0/4$)(step S102). The A/D converter 4 is then instructed to A/D convert the output of the voltage divider circuit 2 (step S103). Continuing, the A/D converted digital signal is then stored in the memory unit 5 (step S104). The operational process performed in steps S101–S104 stores in the memory unit 5 the voltage value of the battery 1 at the instant referenced by variable A1 in FIG. 2.

It is then determined whether or not the variable n is 4 (step S105). Specifically, in step S105 it is determined whether or not four measurements of the battery voltage have been performed. During the first iteration of steps S101–S105, because only one measurement has been performed (i.e., the voltage measurement of the battery 1 performed at instant A1), the determination in step S105 is negative, and the operational process proceeds to step S106 where the variable n is incremented by 1 (step S106). Next, it is determined whether or not the timer 8 has timed out (step S107). If the timer 8 has timed out, the operational process returns to step S102. If the timer 8 has not timed out, step S107 is repeated to determine whether the timer 8 has timed out. Step S102 through step S107 are reiterated until the variable n becomes 4 indicating that four measurements of the battery voltage have been performed.

When the variable n becomes 4, the calculating unit 6 is instructed to calculate the average value of the results of the four measurements of the battery voltage made at instants A1–D1 (step S108). Finally, the decision unit 7 decides whether the calculation result of the calculating unit 6 is above a predetermined threshold, and a display of the result of the decision is performed by the liquid crystal display element 11 (step S109). Steps S101–S109 are repeated during the measurement interval represented by the symbol $T_1$ in FIG. 2 as long as the release button is half-depressed.

As described in detail above, in accordance with embodiments of the present invention, because the voltage of the battery 1 is measured a plurality of times during PWM control, the true battery voltage $BAT_{DC}$ may be accurately detected without distortion of the true voltage of the battery 1 by PWM control.

Moreover, in accordance with embodiments of the present invention, the measurement interval corresponding to $T_1$ may be set to an integral multiple of the interval represented by $T_0$. Alternatively, the interval $T_1$ may not be an integral multiple of the interval $T_0$.

When the measurement interval $T_1$ has been set to an integral multiple of the interval $T_0$, the measurement of battery voltage corresponding to the variables A1, B1, C1 and D1, and the measurement of battery voltage corresponding to the variables A2, B2, C2 and D2, can be made to coincide with respect to the PWM control.

When the measurement interval corresponding to $T_1$ is not an integral multiple of the interval $T_0$, the result is that, as shown in FIG. 2, the measurement values corresponding to the variables A1, B1, C1 and D1 are different from the measurement values corresponding to the variables A2, B2, C2 and D2. However, because the plural measurement points (four in accordance with the embodiment shown in FIG. 2) are averaged, the effect of any error due to the difference of measurement values is made negligible.

Moreover, in accordance with embodiments of the present invention, an average calculation is performed by the calculating unit 6. However, the present invention is not limited to using an average calculation of the measured battery voltage values to determine whether the battery is exhausted, and a root mean square value of the measured battery voltage values may also be used.

In accordance with embodiments of the present invention, a battery voltage detection circuit measures a battery voltage a plurality of times during a measurement interval and combines the measured values by taking an average or root mean square value to measure the battery voltage. Since the interval between each of the plural measurements is made about equal, the voltage of the battery can be accurately measured with a simple device.

Further, in accordance with embodiments of the present invention the battery voltage can be accurately measured during PWM control, and it is not necessary to eliminate the varying periodic signal generated by PWM control when measuring battery voltage.

Although a few preferred embodiments of the present invention have been shown and described, it will be appreciated by those skilled in the art that changes may be made in these embodiments without departing from the principles and spirit of the invention, the scope of which is defined in the claims and their equivalents. Further, one of ordinary skill in the art will recognize that while the preferred embodiments have been shown and described as being used within a photographic device, they may be adapted for use in any device in which it is desirable to accurately measure a battery voltage during PWM control.

What is claimed is:

1. A battery voltage detection system suitable for a photographic device having a battery power source, comprising:

a circuit to generate a varying periodic signal to control operation of a device powered by the battery power source; and a battery voltage detection device to perform plural measurements of the battery voltage during a predetermined time period, and to detect the battery voltage based on the plural measurements, wherein the battery voltage detection device performs the plural measurements of the battery voltage during the generation of the varying periodic signal.

2. A battery voltage detection system as recited in claim 1, wherein the circuit to generate the varying periodic signal is a circuit which performs pulse width modulation control.

3. A battery voltage detection system as recited in claim 2, wherein the circuit which performs pulse width modulation control controls a light emitting diode used for backlighting a liquid crystal display.

4. A battery voltage detection system as recited in claim 1, wherein the battery voltage is measured at approximately equal intervals during the predetermined time period.

5. A battery voltage detection system as recited in claim 4, wherein the battery voltage is measured at intervals of approximately one-fourth the predetermined time period.

6. A battery voltage detection system as recited in claim 1, wherein an average of the plural measurements of battery voltage is used to detect the battery voltage.

7. A battery voltage detection system as recited in claim 1, wherein a root mean square of the plural measurements of battery voltage is used to detect the battery voltage.

8. A battery voltage detection system as recited in claim 3, wherein the predetermined time period corresponds to a 100% duty of a pulse width modulation control pulse output by the circuit which performs pulse width modulation control.

9. A battery voltage detection system as recited in claim 1, wherein the battery voltage detection device comprises, a calculating unit to calculate an average value of the plural measurements of battery voltage, and a decision unit to compare the battery voltage calculated by the calculating unit with a predetermined standard value to determine a state of the battery.

10. A battery voltage detection system as recited in claim 9, further comprising a display to display the state of the battery.

11. A battery voltage detection system as recited in claim 10, wherein the display displays one of an indication that photography is possible, an indication that battery replacement is necessary and an indication that photography is impossible.

12. A camera having a battery voltage detection system, comprising:

a battery power source;

a pulse width modulation control circuit to perform pulse width modulation control;

a battery voltage detection device, including an analog to digital converter to receive an analog output voltage from the battery power source and to convert the analog output voltage to a digital signal representing battery voltage, a timer to provide an analog to digital conversion commencement signal to the analog to digital converter a plurality of times during pulse width modulation control to perform analog to digital conversion of a plurality of battery voltages, a memory unit to store the plurality of digital of signals from the analog to digital converter, a calculating unit to receive the plurality of digital signals representing battery voltages from the memory unit and to calculate the voltage of the battery based on the plurality of battery voltages, a decision unit to compare the battery voltage calculated by the calculating unit with a predetermined value and to decide whether the battery voltage will affect photography; and a display to display the result of decision unit.

13. A camera as recited in claim 12, wherein the calculating unit calculates the battery voltage according to an average of the plurality of battery voltages.

14. A camera as recited in claim 12, wherein the pulse width modulation control circuit controls a light emitting diode used for backlighting a liquid crystal display.

15. A camera as recited in claim 12, wherein the timer provides an analog to digital conversion commencement signal at approximately equal intervals during pulse width modulation control.

* * * * *